United States Patent
Chen et al.

(10) Patent No.: US 10,505,519 B1
(45) Date of Patent: Dec. 10, 2019

(54) DYNAMIC COMPARATOR

(71) Applicant: NXP USA, INC., Austin, TX (US)

(72) Inventors: Tao Chen, Austin, TX (US); Xiankun Jin, Austin, TX (US); Jan-Peter Schat, Schat (DE)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/456,130

(22) Filed: Jun. 28, 2019

(51) Int. Cl.
  *H03K 3/037* (2006.01)

(52) U.S. Cl.
  CPC .................................. *H03K 3/037* (2013.01)

(58) Field of Classification Search
  None
  See application file for complete search history.

(56) References Cited

U.S. PATENT DOCUMENTS

| | | | | |
|---|---|---|---|---|
| 6,392,449 | B1 * | 5/2002 | Taft | H03K 5/2481 327/55 |
| 7,821,303 | B2 * | 10/2010 | Naka | H03K 5/2481 327/55 |
| 7,973,569 | B1 | 7/2011 | Bashar | |
| 8,198,921 | B2 * | 6/2012 | Chen | H03K 5/2481 327/55 |
| 8,810,282 | B2 * | 8/2014 | Li | H03G 3/00 327/54 |
| 9,077,320 | B2 * | 7/2015 | Shu | H03K 5/003 |
| 9,231,577 | B2 * | 1/2016 | Kakamu | H03K 5/249 |
| 9,236,855 | B2 * | 1/2016 | Shu | H03F 3/45 |
| 10,284,187 | B1 * | 5/2019 | K. | H03K 5/2481 |
| 2008/0136460 | A1 * | 6/2008 | Fujiwara | H03K 5/003 327/77 |
| 2016/0380753 | A1 | 12/2016 | Dudulwar et al. | |
| 2018/0226961 | A1 | 8/2018 | Shimauchi et al. | |

OTHER PUBLICATIONS

Almansouri, A., "Improved StrongARM Latch Comparator: Design, Analysis and Performance Evaluation", 2017 13th Conference on Ph.D. Research in Microelectronics and Electronics (PRIME), pp. 89-92, 2017.

Almansouri, A., "A 12.4fJ-FoM 4-Bit Flash ADC Based on the StrongARM Architecture," 2018 14th Conference on Ph.D. Research in Microelectronics and Electronics (PRIME), Prague, pp. 37-40, 2018.

Fayomi, C., "Low power/low voltage high speed CMOS differential track and latch comparator with rail-to-rail input," 2000 IEEE International Symposium on Circuits and Systems. Emerging Technologies for the 21st Century. Proceedings (IEEE Cat No. 00CH36353), Geneva, Switzerland, pp. 653-656 vol. 5; 2000.

(Continued)

*Primary Examiner* — Cassandra F Cox
(74) *Attorney, Agent, or Firm* — David G. Dolezal; Joanna Geld

(57) ABSTRACT

A dynamic comparator includes two sets of input transistors of opposite conductivity types, where a control electrode of one transistor of each set is coupled to a first input of the comparator and a control input of a second transistor of each set is coupled to a second input of the comparator. The comparator includes bypass transistors for pulling current electrodes of either the first set or second set of input transistors to a power supply terminal depending which input voltage is higher as determined by the output.

20 Claims, 2 Drawing Sheets

(56) References Cited

OTHER PUBLICATIONS

Lan, S. "An ultra low-power rail-to-rail comparator for ADC designs," 2011 IEEE 54th International Midwest Symposium on Circuits and Systems (MWSCAS), Seoul, pp. 1-4; 2011.
Liu, N., "Concurrent Sampling with Local Digitization—An Alternative to Analog Test Bus," IEEE 2018 ISCAS, p. 1-5; 2018.
Montanaro, J., "A 160-MHz, 32-b, 0.5-W CMOS RISC microprocessor," in IEEE Journal of Solid-State Circuits, vol. 31, No. 11, pp. 1703-1714, Nov. 1996.
Razavi., B., "The StrongARM Latch [A Circuit for All Seasons]," in IEEE Solid-State Circuits Magazine, vol. 7, No. 2, pp. 12-17, Spring 2015.
U.S. Appl. No. 16/117,317, filed Aug. 30, 2018, entitled "Analog-Test-Bus Apparatuses Involving Calibration of Comparator Circuits and Methods Thereof".

\* cited by examiner

DYNAMIC COMPARATOR

BACKGROUND OF THE INVENTION

Field of the Invention

This invention relates in general to dynamic comparators for electronic systems.

Description of the Related Art

Dynamic comparators are used in electronic circuits for comparing the inputs of the comparator. A dynamic comparator typically receives a clock signal and has a comparing phase (or regenerative phase) where the inputs are compared. The comparator provides an indication of the comparison at an output. Some dynamic comparators include a reset phase where the comparator is reset. Some dynamic comparators may hold their outputs at a resultant state until the next comparing phase.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a dynamic comparator includes two sets of input transistors of opposite conductivity types, where a control electrode of one transistor of each set is coupled to a first input of the comparator and a control input of a second transistor of each set is coupled to a second input of the comparator. The comparator includes bypass transistors for pulling current electrodes of either the first set or second set of input transistors to a power supply terminal based on the comparison.

Providing two sets of input transistors with each set having different conductivity types may enable in some embodiments, the dynamic comparator to compare two input voltages where the common mode of the input voltages is within the magnitude of a threshold voltage of an input transistor of one of the conductivity types from a supply voltage. Accordingly, such a comparator may be able to make comparisons of input voltages within the full range of voltages between voltage supply rails. However, in some cases, providing two input transistors of different conductivity types may prevent an output signal voltage from reaching a voltage of a voltage supply rail (e.g. VSS). Accordingly, providing bypass transistors to couple an output signal voltage to a voltage supply rail in response to a comparison may provide for a "rail to rail" dynamic comparator where the output voltage states are the voltage rail values.

Figure 1:
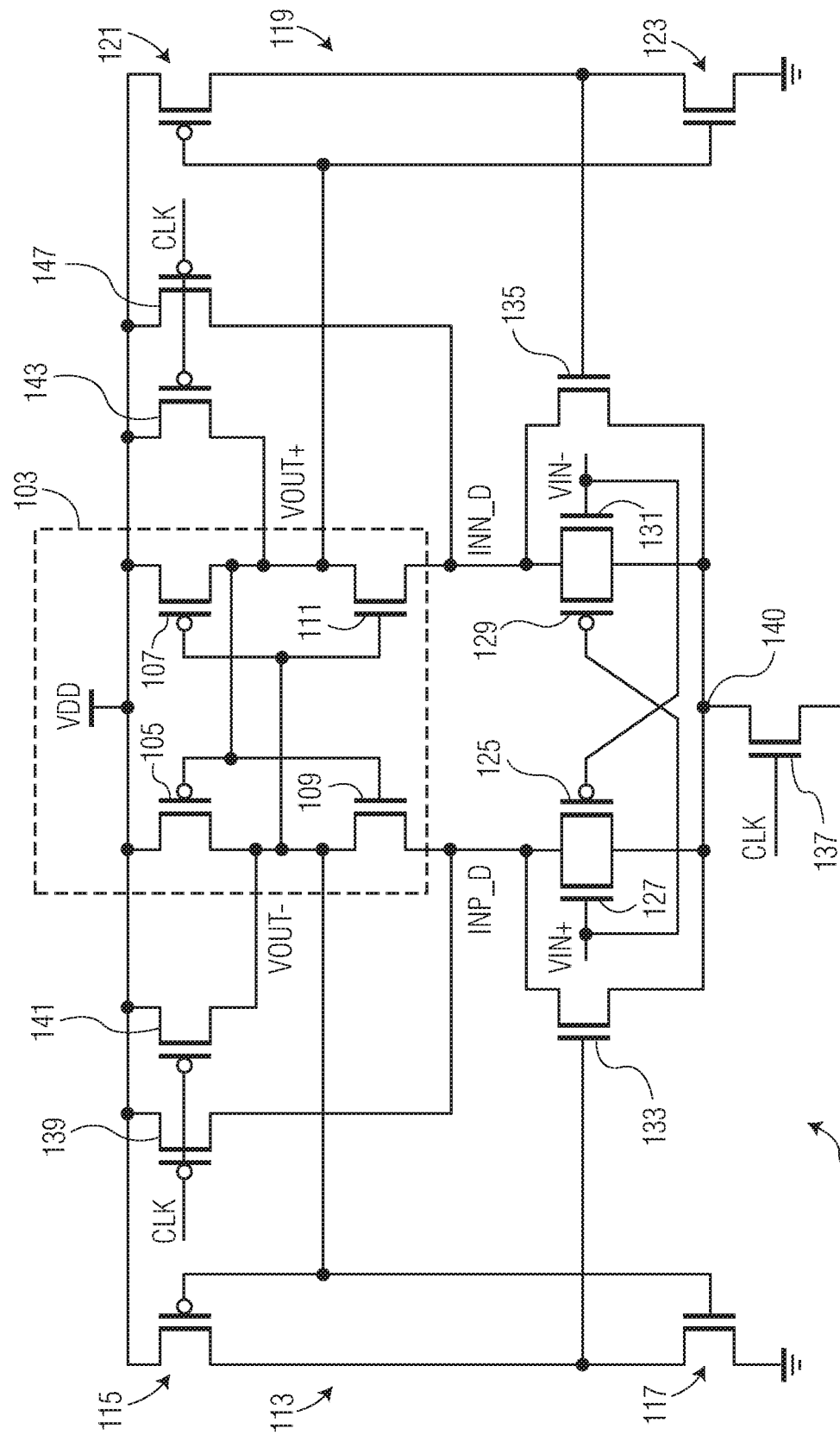
FIG. 1 is a circuit diagram of a dynamic comparator according to one embodiment of the present invention

FIG. 1 is a circuit diagram of a dynamic comparator 101 according to one embodiment of the present invention. Comparator 101 includes a cross coupled latch 103 with two cross coupled inverters. The first inverter includes latch PFET 105 and latch NFET 109, and the second inverter includes latch PFET 107 and latch NFET 111. Comparator 101 may include other types of latches in other embodiments. Comparator 101 includes two sets of input transistors of opposite conductivity types coupled in parallel. One set includes NFET 127 and PFET 125 and the other set is NFET 131 and PFET 129. The gates (control electrodes of a FET) of NFET 127 and PFET 129 are coupled to one comparator input (VIN+) and the gates of NFET 131 and PFET 125 are coupled to the other comparator input (VIN−). Comparator 101 includes a trigger transistor (NFET 137) having a gate coupled to a clock signal (CLK). During a comparison phase which occurs when the clock signal is high, comparator 101 compares the voltage of VIN+ with the voltage of VIN−. If VIN+ has a higher voltage, then the output signal (VOUT+) will be latched at a high voltage state (VDD) and output signal (VOUT−) will be latched at a low voltage state (VSS). If VIN− has a higher voltage, then the output signal (VOUT−) will be latched at a high voltage state (VDD) and output signal (VOUT+) will be latched at a low voltage state (VSS).

NFET 137 is used to implement a comparison phase and a reset phase of comparator 101. When the CLK signal is at a high clock state, NFET 137 is conductive to couple the current electrodes of NFETs 133, 127, 131, and 135 and PFETs 125 and 129 that are connected to node 140 to VSS to enable the comparator to compare VIN+ and VIN− (as further described below). When the CLK signal is in a low clock state, NFET 137 is nonconductive to where current does not flow from node 140 to VSS and a comparison of VIN+ and VIN− is not performed. Also, during a reset phase, reset PFETs 141, 143, 139, and 147 are conductive to pull the output signals VOUT+ and VOUT− and nodes INP_D and INN_D, respectively, to a reset high voltage state (VDD).

In the embodiment shown, during a comparison phase when VIN+ is higher than VIN−, NFET 127 is more conductive than NFET 131 (assuming that VIN+ is higher than the threshold voltage of NFETs 127 and 131) and PFET 125 is more conductive than PFET 129 (assuming that VIN− is lower with respect to VDD than the magnitude of the threshold voltage of PFET 125 and VIN+ is lower with respect to VDD than the magnitude of the threshold voltage of PFET 129). With NFET 127 and PFET 125 being more conductive, node INP_D (which is connected to a current electrode of NFET 127 and a current electrode of PFET 125) is pulled to a lower voltage faster than node INN_D, which is connected to a current electrode of PFET 129 and a current electrode of NFET 131. Accordingly, VOUT− is pulled lower than VOUT+. When VOUT− is pulled lower with respect to VDD than the magnitude of the threshold voltage of PFET 107, PFET 107 becomes conductive to pull VOUT+ to VDD. VOUT+ being pulled to VDD makes NFET 109 conductive to where VOUT− is pulled to the voltage of node INP_D. VOUT+ and VOUT− remain at these voltages until the reset phase (CLK transitions to a low clock state) where VOUT+ and VOUT− are pulled to VDD when PFETs 139, 141, 143, and 147 are made conductive.

In the embodiment shown, during a comparison phase when VIN− is higher than VIN+, NFET 131 is more conductive than NFET 127 (assuming that VIN− is higher than the threshold voltage of NFETs 127 and 131) and PFET 129 is more conductive than PFET 125 (assuming that VIN+ is lower with respect to VDD than the magnitude of the threshold voltage of PFET 129 and VIN− is lower with respect to VDD than the magnitude of the threshold voltage of PFET 125). With NFET 131 and PFET 129 being more conductive, node INN_D (which is connected to a current electrode of NFET 131 and a current electrode of PFET 129) is pulled to a lower voltage faster than node INP_D, which is connected to a current electrode of PFET 125 and a current electrode of NFET 127. Accordingly, VOUT+ is pulled lower than VOUT−. When VOUT+ is pulled lower with respect to VDD than the magnitude of the threshold voltage of PFET 105, PFET 105 becomes conductive to pull VOUT− to VDD. VOUT− being pulled to VDD makes NFET 111 conductive to where VOUT+ is pulled to the voltage of node INN_D.

In the embodiment shown, by including input PFETs 125 and 129, comparator 101 is designed to provide a "rail to rail" comparison of any two voltages between VSS and VDD. If comparator 101 did not include input PFETs 125 and 129, then comparator 101 could not compare two voltages that are less than the threshold voltages of input NFETs 127 and 131. In such a case, neither NFET 127 nor NFET 131 would turn on. Adding PFETs 125 and 129 allows comparator 101 to provide a comparison between two voltages that are below the threshold voltage of NFETs 127 and 131 (e.g. two input voltages having a common mode of less than the threshold voltages of NFETs 127 and 131).

As supply voltage ranges decrease with smaller process nodes, the threshold voltage of the input NEFTs (127 and 131) becomes a greater percentage of the supply voltage range. In one example of a comparator implemented in a 16 nm finFET process node, the supply voltage range is 800 mV (VDD minus VSS) and the threshold voltage of the NFET input transistors are 250 mV. Consequently, a comparator with input transistors of only one conductivity type (e.g. NFETs only) would not be operable to compare voltages in 31.25% of the supply voltage range. Therefore, providing a comparator with input transistors of both conductivity types (e.g. both PFETs and NFETs), enables the comparator to make comparisons for input voltages for the entire supply voltage range. In other embodiments, a comparator with input transistors of both conductivity types may be able to compare voltages above VDD and below VSS.

However, one issue with adding PFETs as input transistors (e.g. PFETs 125 and 129) to the design of FIG. 1 is that in certain cases, the voltage of either VOUT+ or VOUT− cannot drop below VIN− or VIN+, respectively, plus the magnitude of the threshold voltages of input PFETs 125 and 129. If the input voltages are below the threshold voltages of NFETs 127 and 131, then either node INP_D or INN_D which is coupled to the output signal VOUT− or VOUT+ of the lower output voltage will only go to the voltage of the lower voltage input signal (e.g. VIN+ or VIN−) plus the magnitude of the threshold voltage of PFET 125 or PFET 129, respectively.

In order to be able to pull nodes INP_D and INN_D to VSS during a comparison phase (and to pull the lower of VOUT+ and VOUT− to VSS), comparator 101 includes bypass NFETs 133 and 135 where the gate of each bypass NFET is controlled by an inverter that inverts one of the output signals (VOUT−, VOUT+). The gate of bypass NFET 133 is connected to the output of inverter 113, which inverts VOUT−, and the gate of bypass NFET 135 is connected to the output of inverter 119, which inverts VOUT+. Inverter 113 includes PFET 115 and NFET 117, and inverter 119 includes PFET 121 and NFET 123. Once the voltage of either VOUT+ or VOUT− falls below VDD minus the magnitude of the threshold voltage of PFET 121 or 115, NFET 135 or 133 becomes conductive to pull node INN_D or node INP_D to VSS, respectively. The other of NFET 133 and 135 will remain nonconductive during the comparison phase.

Consequently, by adding bypass transistors, (NFETs 133 and 135), a comparator can implement input transistors of both conductively types (N and P) while still being able to pull the lower voltage signal (VOUT+ or VOUT−) of the latch output to VSS during the comparison phase.

Figure 2:
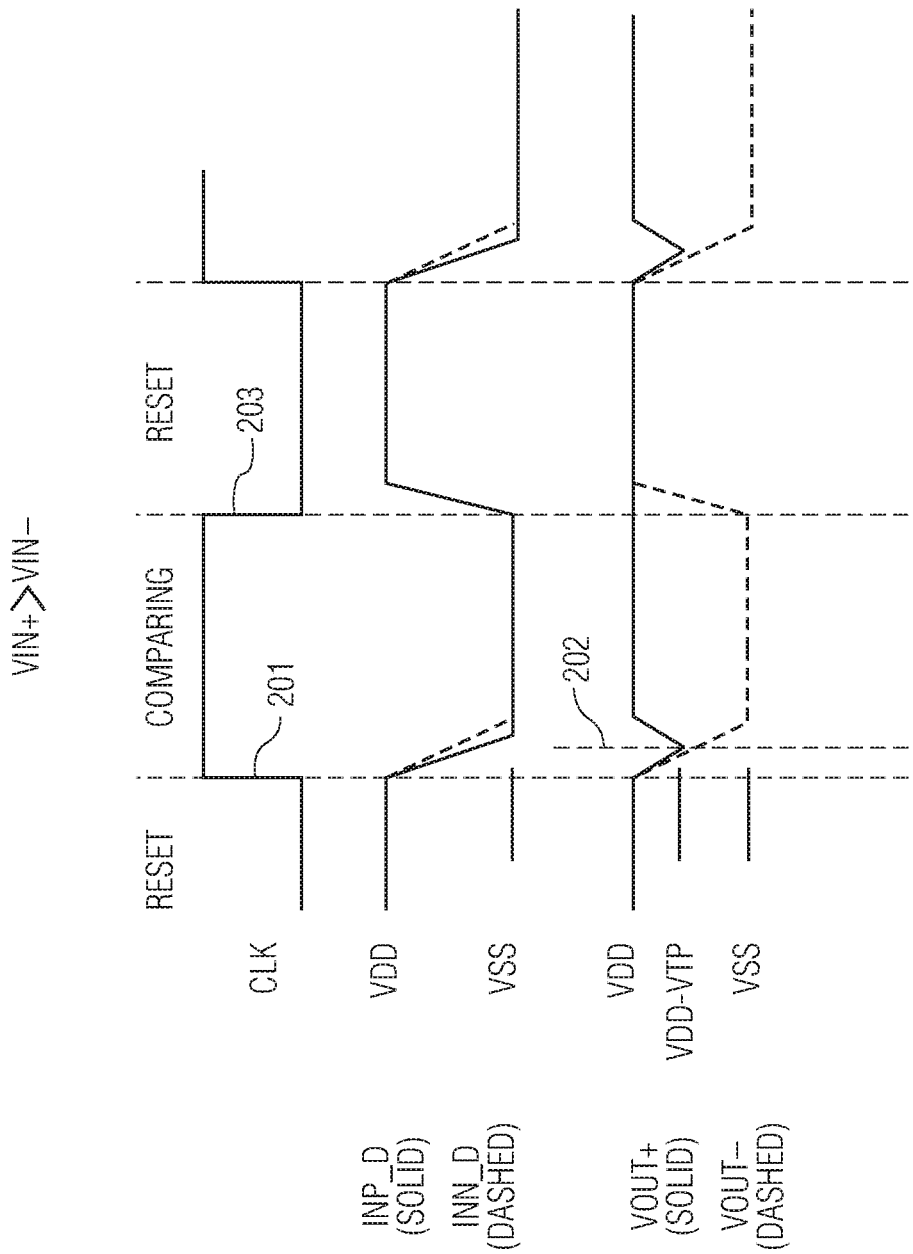
FIG. 2 shows a timing diagram of the dynamic comparator of FIG. 1 according to one embodiment of the present invention.

FIG. 2 is a timing diagram showing the operation of comparator 101 where VIN+ is at a higher voltage than VIN−. Prior to the rising edge 201 of clock signal CLK, comparator 101 is in a reset phase where VOUT+(solid line) and VOUT− (dashed line) are at voltage VDD due to PFETs 143 and 141 being conductive, respectively, and INN_D and INP_D are at VDD due to PFETs 147 and 139 being conductive, respectively. At this time, NFETs 133 and 135, are nonconductive in that the inverted outputs of VOUT− and VOUT+ are at VSS. NFET 137 is also nonconductive.

The comparison phase begins with the rising edge 201 of the clock signal CLK. As a result, reset PFETs 141, 143, 139 and 147 become nonconductive to where VOUT−, VOUT+, INP_D, and INN_D, respectively, are no longer tied to VDD by those devices. Also, at rising edge 201, trigger NFET 137 becomes conductive to enable the current paths though the input transistors (NFET 127, NFET 131, PFET 125, and PFET 129), nodes INP_D and INN_D, and latch 103.

Because VIN+ is at a higher voltage than VIN−, the current path through node INP_D is more conductive than the current path through node INN_D. If VIN+ is less than the threshold voltage of NFET 127, then the current from node INP_D flows through PFET 125 in that NFET 127 is nonconductive because VIN+ is less than its threshold voltage. If VIN− is at a voltage higher than VDD minus the magnitude of the threshold voltage of PFET 125, then the current flows through NFET 127 in that PFET 125 is nonconductive because VIN− is higher than VDD minus the magnitude of its threshold voltage. If the voltage of VIN+ is above the threshold voltage of NFET 127 from VSS and VIN− is below the magnitude of the threshold voltage of PFET 125 from VDD, then current will flow through both NFET 127 and PFET 125. NFET 131 is responsive to the VIN− signal and PFET 129 in responsive to the VIN+ signal in the same way for current flowing through node INN_D.

As shown in FIG. 2, because the current through node INP_D is higher than through node INN_D, the voltage of node INP_D (shown in the solid line of FIG. 2) decreases faster than the voltage of node INN_D (shown in the dashed line of FIG. 2). Because the voltage of node INP_D decreases faster, the voltage at the gate of PFET 107 will fall below its trip voltage (VDD minus the magnitude of the threshold voltage of PFET 107) before the voltage at the gate of PFET 105 falls below its trip voltage. When the voltage at the gate of PFET 107 falls below its trip voltage at time 202 in FIG. 2, PFET 107 becomes conductive to pull the voltage of VOUT+ to VDD to indicate that VIN+ is at a higher voltage than VIN−. With VOUT+ being pulled to VDD, PFET 105 becomes nonconductive and NFET 109 becomes conductive to pull VOUT− to the voltage of INP_D. Also, with VOUT− being pulled lower to the voltage of INP_D, PFET 115 begins to conduct and pulls the voltage of the gate of bypass NFET 133 towards VDD which makes NFET 133 conductive to pull node INP_D (and conversely VOUT−) towards VSS. Pulling VOUT− towards VSS makes PFET 115 more conductive to pulls the voltage of the gate of bypass NFET 133 towards VDD with a higher current which makes NFET 133 more conductive pull to node INP_D to VSS (and the voltage of VOUT− as well). In addition, pulling VOUT− to VSS makes PFET 107 even more conductive to pull VOUT+ to VDD. With VOUT+ going to VDD, NFET 123 is made conductive to pull the voltage of the gate of NFET 135 to VSS to keep bypass NFET 135 nonconductive.

At the falling edge 203 of the CLK signal, comparator goes back into the reset phase, where reset PFETs 141, 143, 139, and 147 are made conductive to pull the VOUT− and VOUT+ signals and nodes INP_D and INN_D to VDD. NFET 137 is also made nonconductive.

Comparator 101 works in a similar way when the voltage of VIN− is greater than the voltage of VIN+. In such a case, node INN_D and signal VOUT− would be represented by the solid lines in FIG. 2 and node INP_D and signal VOUT+ would be represented by the dashed lines in FIG. 2.

One advantage that may occur where a comparator includes two sets of input transistors with each input transistor of the set being of a different conductivity type is that the offset voltage due to device mismatch may be reduced, especially for instances where the common mode voltage of VIN+ and VIN− is around ½ (VDD-VSS). The offset voltage of a comparator is the voltage difference between the two input terminals that causes the output terminal to change from logic-low to logic-high.

In some embodiments, a comparator's offset voltage due to device mismatch for input signals with a common mode voltage around ½ (VDD-VSS) may be reduced by approximately half over a comparator with input transistors of only one conductivity type.

In some embodiments, input PFETs 125 and 129 are of a similar device size to input NFETs 127 and 131, although in other embodiments, the input PFETs have a larger device size than the input NFETs. It may be preferable in some embodiments to size the input PFETs larger than the minimal PFET device size and size the input NFETs larger than a minimal NFET device size in order to reduce the offset voltage. In some embodiments, PFETs 115 and 121 can be of a minimal PFET size and NFETs 117, 123, 133, and 135 can be of a minimal NFET size to reduce device area.

In the embodiment shown, comparator 101 is characterized as a strongARM comparator, but may be of another type of comparator in other embodiments. In one embodiment, comparator 101 is utilized for testing analog signals with respect to a voltage reference, wherein the comparator is capable of performing rail to rail testing of the analog signals. In other embodiments, comparator 101 may be used in other types of circuits such as analog to digital converters and sense amplifiers.

In the embodiment shown, comparator 101 is implemented with field effect transistors (FET), but may be implemented with other types of transistors in other embodiments. Also, in the embodiment of FIG. 1, comparator 101 is characterized as having an N-type comparator configuration where the trigger transistor (NFET 137) is an n-type transistor and the reset transistors (PFETs 139, 141, 143, and 147) couple VOUT− and VOUT+ to VDD when in the reset phase. However, in other embodiments, a comparator may have a P-type configuration that includes a P-type trigger transistor connected to the VDD rail and N-type reset transistors that bias VOUT−, VOUT+, INP_D and INN_D to VSS during a reset phase. With such a P-type configuration, the input transistors would be located between VDD and the latch.

In one embodiment, a dynamic comparator includes a first input transistor of a first conductivity type having a control electrode coupled to a first input node and a second input transistor of the first conductivity type having a control electrode coupled to a second input node. The dynamic comparator includes a third input transistor of a second conductivity type, opposite the first conductivity type, having a control electrode coupled to the second input node and a fourth input transistor of the second conductivity type having a control electrode coupled to the first input node. The dynamic comparator includes a latch having a first output node, a second output node, a first terminal coupled to a first supply terminal, a second terminal coupled to first current electrodes of the first and third input transistors, and a third terminal coupled to first current electrodes of the second and fourth input transistors. The dynamic comparator includes a trigger transistor of the first conductivity type having a control electrode coupled to a clock input node, a first current electrode coupled to second current electrodes of the first, second, third, and fourth input transistors, and a second current electrode coupled to a second supply terminal. The dynamic comparator includes a first inverter having an input coupled to the first output node of the latch and a second inverter having an input coupled to the second output node of the latch. The dynamic comparator includes a first bypass transistor having a first current electrode coupled to the first current electrodes of the first and third input transistors, a second current electrode coupled the second current electrodes of the first and third input transistors, and a control electrode coupled to an output of the second inverter. The dynamic comparator includes a second bypass transistor having a first current electrode coupled to the first current electrodes of the second and fourth input transistors, a second current electrode coupled to the second current electrodes of the second and fourth input transistors, and a control electrode coupled to an output of the first inverter.

Another embodiment includes a method of operating a dynamic comparator having a latch with a first, second, and third terminals. The first terminal is coupled to a first supply terminal. The method includes receiving a first input voltage at a control electrode of a first transistor of a first conductivity type and a second input voltage at a control electrode of a second transistor of a first conductivity type, opposite a second conductivity type. During a comparing phase of the dynamic comparator when a common mode voltage between the first input voltage and the second input voltage is within a magnitude of a threshold voltage of the first transistor of a supply voltage of a second supply terminal, current of the second terminal conducts through a third transistor of the second conductivity type coupled in parallel with the first transistor, and current of the third terminal conducts through a fourth transistor of the second conductivity type coupled in parallel with the second transistor. One of a fifth bypass transistor of the first conductivity type coupled in parallel with the first transistor is made conductive in response to a first output of the latch indicating that the first input voltage is higher than the second input voltage to pull the second terminal to a voltage of the second supply terminal or a sixth bypass transistor of the first conductivity type coupled in parallel with the second transistor is made conductive in response to a second output of the latch indicating that the second input voltage is higher than the first input voltage to pull the third terminal to the voltage of the second supply terminal.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A dynamic comparator, comprising:
    a first input transistor of a first conductivity type having a control electrode coupled to a first input node;
    a second input transistor of the first conductivity type having a control electrode coupled to a second input node;
    a third input transistor of a second conductivity type, opposite the first conductivity type, having a control electrode coupled to the second input node;
    a fourth input transistor of the second conductivity type having a control electrode coupled to the first input node;
    a latch having a first output node, a second output node, a first terminal coupled to a first supply terminal, a second terminal coupled to first current electrodes of the first and third input transistors, and a third terminal coupled to first current electrodes of the second and fourth input transistors;
    a trigger transistor of the first conductivity type having a control electrode coupled to a clock input node, a first current electrode coupled to second current electrodes of the first, second, third, and fourth input transistors, and a second current electrode coupled to a second supply terminal;
    a first inverter having an input coupled to the first output node of the latch;
    a second inverter having an input coupled to the second output node of the latch;
    a first bypass transistor having a first current electrode coupled to the first current electrodes of the first and third input transistors, a second current electrode coupled the second current electrodes of the first and third input transistors, and a control electrode coupled to an output of the second inverter; and
    a second bypass transistor having a first current electrode coupled to the first current electrodes of the second and fourth input transistors, a second current electrode coupled to the second current electrodes of the second and fourth input transistors, and a control electrode coupled to an output of the first inverter.

2. The dynamic comparator of claim 1, wherein the dynamic comparator is configured to, during a comparing phase of a clock signal received at the clock input node, provide a first state voltage at the first output node and a second state voltage at the second output node when a voltage at the first input node is greater than a voltage at the second input node, and provide an first state voltage at the second output node and the second state voltage at the first output node when the voltage the second input node is greater than the voltage at the first input node.

3. The dynamic comparator of claim 1, further comprising:
    a first reset transistor of the second conductivity type having a first current electrode coupled to the first supply terminal, a second current electrode coupled to the second output node, and a control electrode coupled to the clock input node; and
    a second reset transistor of the second conductivity type having a first current electrode coupled to the first supply terminal, a second current electrode coupled to the first output node, and a control electrode coupled to the clock input node.

4. The dynamic comparator of claim 1, further comprising:
    a first reset transistor of the second conductivity type having a first current electrode coupled to the first supply terminal, a second current electrode coupled to the second terminal of the latch, and a control electrode coupled to the clock input node; and
    a second reset transistor of the second conductivity type having a first current electrode coupled to the first supply terminal, a second current electrode coupled to the third terminal of the latch, and a control electrode coupled to the clock input node.

5. The dynamic comparator of claim 4, further comprising:
    a third reset transistor of the second conductivity type having a first current electrode coupled to the first supply terminal, a second current electrode coupled to the second output node, and a control electrode coupled to the clock input node; and
    a fourth reset transistor of the second conductivity type having a first current electrode coupled to the first supply terminal, a second current electrode coupled to the first output node, and a control electrode coupled to the clock input node.

6. The dynamic comparator of claim 1, wherein the latch comprises:
    a first latch transistor of the second conductivity type and having a first current electrode coupled to the first terminal, a control electrode coupled to the first output node, and a second current electrode coupled to the second output node;
    a second latch transistor of the second conductivity type and having a first current electrode coupled to the first terminal, a control electrode coupled to the second output node, and a second current electrode coupled to the first output node;
    a third latch transistor of the first conductivity type and having a first current electrode coupled to the second output node, a control electrode coupled to the control electrode of the first latch transistor and to the first output node, and a second current electrode coupled to the second terminal; and
    a fourth latch transistor of the first conductivity type and having a first current electrode coupled to the first output node, a control electrode coupled to the control electrode of the second latch transistor and to the second output node, and a second current electrode coupled to the third terminal.

7. The dynamic comparator of claim 1, wherein the first inverter includes:
    a first transistor of the second conductivity type having a first current electrode coupled to the first supply terminal, a control electrode coupled to the first output node, and a second current electrode coupled to the control electrode of the second bypass transistor; and
    a second transistor of the first conductivity type having a first current electrode coupled to the second current electrode of the first transistor and the control electrode of the second bypass transistor, and a second current electrode coupled to the second supply terminal.

8. The dynamic comparator of claim 7, wherein the second inverter includes:

a third transistor of the second conductivity type having a first current electrode coupled to the first supply terminal, a control electrode coupled to the second output node, and a second current electrode coupled to the control electrode of the first bypass transistor; and a fourth transistor of the first conductivity type having a first current electrode coupled to the second current electrode of the third transistor and the control electrode of the first bypass transistor, and a second current electrode coupled to the second supply terminal.

9. The dynamic comparator of claim 1, wherein the first supply terminal is configured to receive a first supply voltage, and the second supply terminal is configured to receive a second supply voltage, wherein the first supply voltage is greater than the second supply voltage.

10. The dynamic comparator of claim 9, wherein the first conductivity type is N type and the second conductivity type is P type.

11. The dynamic comparator of claim 1, wherein the first supply terminal is configured to receive a first supply voltage, and the second supply terminal is configured to receive a second supply voltage, wherein the second supply voltage is greater than the first supply voltage.

12. The dynamic comparator of claim 11, wherein the first conductivity type is P type and the second conductivity type is N type.

13. The dynamic comparator of claim 1, wherein the dynamic comparator is characterized as a strongARM comparator.

14. The dynamic comparator of claim 1, wherein:
the first input transistor, the third input transistor, and the first bypass transistor are coupled in parallel;
the second input transistor, the fourth input transistor, and the second bypass transistor are coupled in parallel.

15. A method of operating a dynamic comparator having a latch with a first, second, and third terminals, the first terminal coupled to a first supply terminal, comprising:
receiving a first input voltage at a control electrode of a first transistor of a first conductivity type and a second input voltage at a control electrode of a second transistor of a first conductivity type, opposite a second conductivity type;
wherein during a comparing phase of the dynamic comparator when a common mode voltage between the first input voltage and the second input voltage is within a magnitude of a threshold voltage of the first transistor of a supply voltage of a second supply terminal, current of the second terminal conducts through a third transistor of the second conductivity type coupled in parallel with the first transistor, and current of the third terminal conducts through a fourth transistor of the second conductivity type coupled in parallel with the second transistor, wherein one of a fifth bypass transistor of the first conductivity type coupled in parallel with the first transistor is made conductive in response to a first output of the latch indicating that the first input voltage is higher than the second input voltage to pull the second terminal to a voltage of the second supply terminal or a sixth bypass transistor of the first conductivity type coupled in parallel with the second transistor is made conductive in response to a second output of the latch indicating that the second input voltage is higher than the first input voltage to pull the third terminal to the voltage of the second supply terminal.

16. The method of claim 15, wherein the fifth bypass transistor includes a control electrode coupled to a first inverter that inverts the first output and a sixth bypass transistor includes a control electrode coupled to a second inverter that inverts the second output.

17. The method of claim 15, wherein current of the second terminal and current of the third terminal begin conducting in response to one edge type of a rising edge and a falling edge of a clock signal.

18. The method of claim 17, wherein the second terminal is coupled to first current electrodes of the first and third transistors, and the third terminal is coupled to first current electrodes of the second and fourth transistors, and wherein a trigger transistor has a first current electrode coupled to second current electrodes of the first, second, third, and fourth transistors, a second current electrode coupled to the second supply terminal, and a control electrode coupled to receive the clock signal.

19. The method of claim 17, wherein, in response to an other edge type of the rising edge and falling edge of the clock signal, resetting the second terminal to a supply voltage of the first supply terminal through a first reset transistor of the second conductivity type and resetting the third terminal to the supply voltage of the first supply terminal through a second reset transistor of the second conductivity type.

20. The method of claim 15 further comprising:
providing at the first output a higher output voltage and providing at the second output a lower output voltage when the second input voltage is at a higher voltage than the first input voltage during the comparing phase; and
providing at the second output a higher output voltage and providing at the first output a lower output voltage when the first input voltage is at a higher voltage than the second input voltage during the comparing phase.

* * * * *